(12) United States Patent
Braun

(10) Patent No.: US 6,646,490 B1
(45) Date of Patent: Nov. 11, 2003

(54) BIPOLAR BREAKDOWN ENHANCEMENT CIRCUIT FOR TRI-STATE OUTPUT STAGE

(75) Inventor: Eric Braun, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/224,671

(22) Filed: Aug. 20, 2002

(51) Int. Cl.[7] .............................................. H03K 17/16
(52) U.S. Cl. ......................... 327/432; 327/433; 326/56
(58) Field of Search ................................ 327/112, 108, 327/433, 420, 432; 326/56

(56) References Cited

U.S. PATENT DOCUMENTS 5,083,048 A * 1/1992 Kashimura .................. 326/56
5,262,689 A * 11/1993 Glica et al. ................. 327/432
5,966,041 A   10/1999 Moane ........................ 327/417

* cited by examiner

Primary Examiner—Dinh T. Le
(74) Attorney, Agent, or Firm—Koppel, Jacobs, Patrick & Heybl

(57) ABSTRACT

A bipolar transistor breakdown voltage enhancement circuit extends the voltage swing which can be tolerated at an output terminal driven by an emitter follower-connected bipolar output transistor operating in a high impedance state. The enhancement circuit connects the base of the output transistor to a voltage which extends the allowable high impedance output voltage swing: an NPN output transistor's base is tied to a voltage that is the lower of the output voltage or ground, and a PNP output transistor's base is tied to a voltage which is the higher of the output voltage or VDD.

17 Claims, 2 Drawing Sheets

BIPOLAR BREAKDOWN ENHANCEMENT CIRCUIT FOR TRI-STATE OUTPUT STAGE

BACKGROUND OF THE INVENTION

1. Field of the Invention

This invention relates to the field of bipolar transistor output stages, and particularly to methods of enhancing the output transistors' breakdown characteristics when the output stage is in a high impedance mode.

2. Description of the Related Art

Many interface circuits require output stages which are capable of operating in a "tri-state" or "high impedance" mode, in which the output terminal presents a high impedance to the external circuitry connected to it. This external circuitry is often powered with supply voltages which differ from those used by the interface circuit. As a result, the output stage's output transistors may need to withstand voltages which swing above and below the interface circuit's power forms without breaking down.

In a conventional bipolar interface circuit, the output stage consists of one or two bipolar output transistors which are emitter follower-connected to the output terminal. To put the output stage into a high impedance mode, the bases of the output transistors are left floating. When so arranged, the high impedance output voltage swing range is limited to the transistors' open base breakdown voltages $BV_{eco}$ (emitter reverse-biased compared to the base) and $BV_{ceo}$ (collector reverse-biased compared to the base). For example, if an interface circuit is powered with a supply voltage VDD of 5 volts, and its output stage includes an emitter follower-connected NPN output transistor having a $BV_{eco}$ of 5 volts and a $BV_{ceo}$ of 20 volts, the allowable output voltage swing is given by:

(VDD−$BV_{ceo}$) to (VDD+$BV_{eco}$)=−15 volts to +10 volts.

If the interface circuit's output terminal is subjected to voltage swings beyond this range, the tri-state requirement may be violated and the output transistor may be damaged or destroyed.

SUMMARY OF THE INVENTION

A bipolar transistor breakdown voltage enhancement circuit is presented which overcomes the limitations noted above. The invention extends the high impedance output voltage swing which can be tolerated at an interface circuit's output terminal which is driven by an emitter follower-connected bipolar transistor.

The present invention is a circuit which, when an emitter follower-connected bipolar output transistor is to be in a high impedance state, connects the base of the output transistor to a voltage which extends the allowable output voltage swing. When the output transistor is an NPN, the invention ties the transistor's base to a voltage that is the lower of the interface circuit's output voltage or ground (or another low impedance voltage path). For a PNP output transistor, the transistor's base is tied to a voltage which is the higher of the interface circuit's output voltage or VDD (or another low impedance voltage path). By shorting the base in this way, the output transistor's breakdown characteristic is enhanced, such that the allowable voltage swing is extended by up to 50% or more.

Further features and advantages of the invention will be apparent to those skilled in the art from the following detailed description, taken together with the accompanying drawings.

DETAILED DESCRIPTION OF THE INVENTION

Figure 1A:
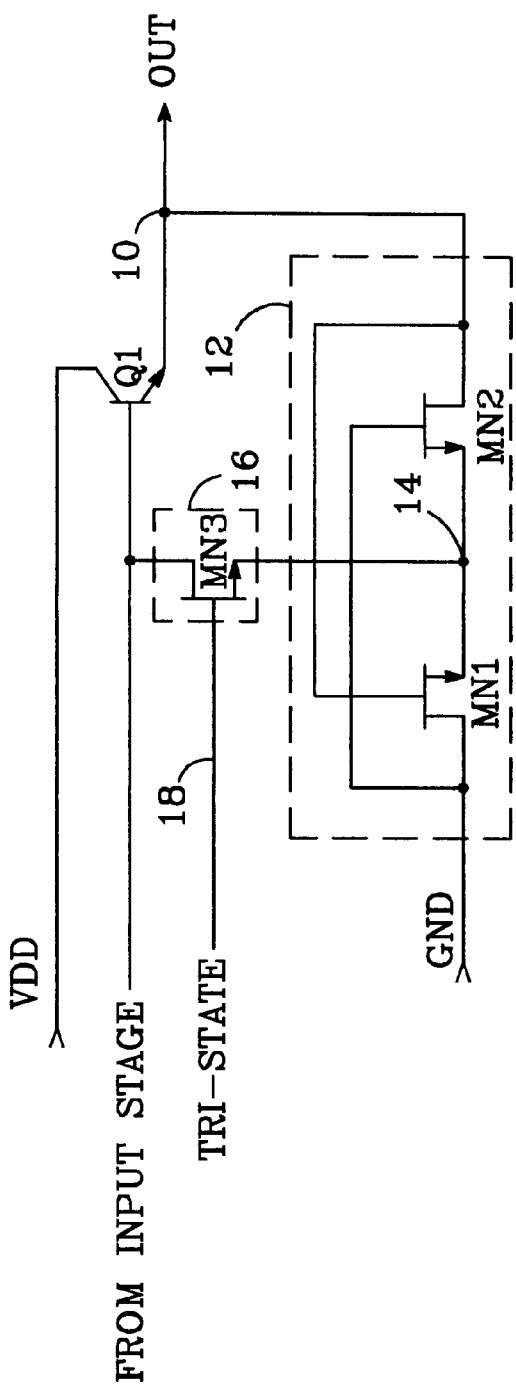
FIG. 1a is a schematic diagram of a bipolar breakdown enhancement circuit as might be used with an emitter follower-connected NPN output transistor.

FIG. 1a illustrates an exemplary embodiment of a breakdown enhancement circuit in accordance with the present invention, as might be used with an interface circuit's emitter follower-connected NPN output transistor. The collector-emitter circuit of an NPN output transistor Q1 is connected between a supply voltage VDD and an output terminal 10. Q1 is emitter-follower connected; i.e., a signal applied to Q1's base—from an input stage, for example—appears at its emitter, and thus at output terminal 10. The voltage at output terminal 10 is the interface circuit's output OUT, which is referenced to a voltage potential GND; GND is typically ground, but may be a non-zero potential as well.

The invention extends the allowable voltage swing at output terminal 10 when Q1 is operated in a high impedance state. This is accomplished by shorting Q1's base to a particular voltage. A comparison circuit 12 produces an output at a node 14 which is the lesser of output voltage OUT and GND. A switch 16 is arranged to connect the base of output transistor Q1 to the output 14 of comparison circuit 12, in response to a tri-state control signal 18 which is asserted when Q1 is to be placed in a high-impedance state. Thus, when Q1 is placed in high impedance mode via tri-state control signal 18, the base of Q1 is shorted to the lesser of OUT and GND.

This serves to extend Q1's breakdown voltage, and thus the voltage swing which can be tolerated at output terminal 10 without damaging Q1 or violating the tri-state requirement. In a conventional output stage, when Q1 is operated in high impedance mode, its base is left floating. As noted above, this results in a high impedance output voltage swing range which is limited to Q1's open base breakdown voltages $BV_{eco}$ and $BV_{ceo}$, with the allowable output voltage swing given by:

$(VDD-BV_{ceo})$ to $(VDD+BV_{eco})$.

However, when configured as shown in FIG. 1a, the high impedance output voltage swing range is extended out to Q1's shorted base breakdown voltages $BV_{ecs}$ and $BV_{ces}$. The shorted base breakdown voltages tend to be higher (typically about double) than the open base breakdown voltages. When closed, switch 16 connects Q1's base to a low impedance source (node 14), which ensures the higher breakdown voltages. When employing the present breakdown enhancement circuit, the high impedance output voltage swing range is given by:

$(VDD-BV_{ces})$ to $(VDD+BV_{ecs})$.

As an example, assume the following parameters:
VDD=5 volts
$BV_{eco}$=5 volts $BV_{ceo}$=20 volts
$BV_{ecs}$=10 volts
$BV_{ceo}$=40 volts The allowable output voltage swing with Q1's base left open is given by:

$(VDD-BV_{ceo})$ to $(VDD+BV_{eco})$=−15 volts to +10 volts.

When used with the invention, however, the allowable output voltage swing is given by:

$(VDD-BV_{ces})$ to $(VDD+BV_{ecs})$=−35 volts to +15 volts.

This extended voltage swing enables the interface circuit to tolerate a wider range of voltages on output terminal 10 without damaging or destroying Q1, or violating the tri-state requirement (which happens when breakdown occurs and current flows into or out of the output terminal).

The invention finds particular applicability when the interface circuit is connected to external circuitry which is powered with different (and possibly higher) supply voltages. This might be found, for example, if the interface circuit is a bus transmitter or a power converter.

Comparison circuit 12 is preferably implemented with a pair of field-effect transistors (FETs) MN1 and MN2. The drain-source circuit of MN1 is connected between GND and node 14, with its gate connected to OUT. Similarly, the drain-source circuit of MN2 is connected between OUT and node 14, with its gate connected to GND. When so arranged, the lesser of OUT and GND appears at node 14. When this voltage is connected to the base of Q1 via switch 16, the extended output voltage swing defined above is achieved.

Switch 16 is preferably implemented with a FET MN3, having its drain-source circuit connected between Q1's base and node 14, and receiving tri-state control signal 18 at its gate.

As noted above, when Q1 is to be in a high impedance state, its base is connected to the lesser of OUT and GND. This is required to maintain Q1 in its tri-state mode (i.e., not forward-biased) when OUT<GND−$V_{be,on}$. As such, if the interface circuit has other low impedance voltage paths available which might be even lower than OUT or GND, comparison circuit 12 can be adapted to include these voltages in the comparison with OUT and GND, or to compare OUT with one of these voltages instead of with GND. In all cases, comparison circuit 12 is arranged to provide the lowest available voltage at node 14.

Figure 1B:
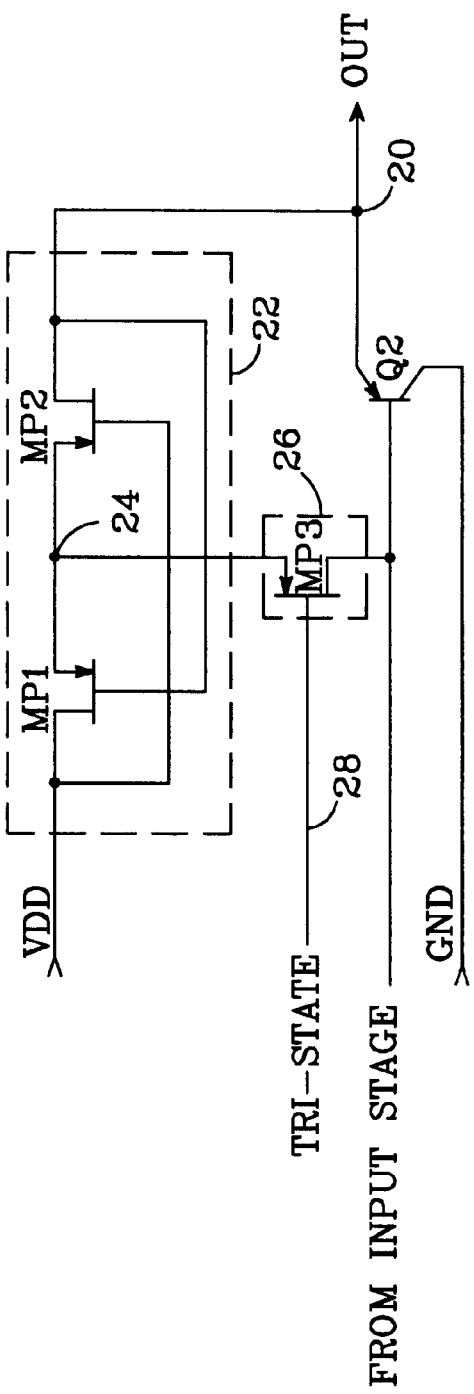
FIG. 1b is a schematic diagram of a bipolar breakdown enhancement circuit as might be used with an emitter follower-connected PNP output transistor.

FIG. 1b illustrates an implementation of the invention with an interface circuit's emitter follower-connected PNP output transistor. The interface circuit is connected between a supply voltage VDD and a ground potential GND (which may be non-zero). The collector-emitter circuit of a PNP output transistor Q2 is connected between GND and an output terminal 20; a signal applied to Q2's base appears at its emitter, and thus at output terminal 20. The voltage at output terminal 20 is the interface circuit's output OUT, which is referenced to voltage potential GND (which may be non-zero).

Here, a comparison circuit 22 produces an output at a node 24 which is the greater of output voltage OUT and VDD. A switch 26 connects the base of output transistor Q2 to the output 24 of comparison circuit 22 in response to a tri-state control signal 28 which is asserted when Q2 is to be placed in a high-impedance state. This serves to extend Q2's breakdown voltage, and thus the voltage swing which can be tolerated at output terminal 20 without damaging Q2 or violating the tri-state requirement.

If the base of Q2 is left floating, the high impedance output voltage swing range is limited to Q2's open base breakdown voltages $BV_{eco}$ and $BV_{ceo}$, with the allowable output voltage swing given by:

$(GND-BV_{eco})$ to $(GND+BV_{ceo})$.

However, when configured as shown in FIG. 1b, the high impedance output voltage swing range is extended out to Q2's shorted base breakdown voltages $BV_{ecs}$ and $BV_{ces}$. Thus, when employing the present breakdown enhancement circuit, the high impedance output voltage swing range is given by:

$(GND-BV_{ecs})$ to $(GND+BV_{ces})$.

As an example, assume the following parameters:

GND=0 volts
$BV_{eco}$=10 Volts
$BV_{ceo}$=40 volts
$BV_{ecs}$=20 volts
$BV_{ces}$=80 volts The allowable output voltage swing with Q2's base left open is given by:

$(GND-BV_{eco})$ to $(GND+BV_{ceo})$=−10 volts to +40 volts.

When used with the invention, however, the allowable output voltage swing is given by:

$(GND-BV_{ecs})$ to $(GND+BV_{ces})$=−20 volts to +80 volts.

This extended voltage swing enables the interface circuit to tolerate a wider range of voltages on output terminal 20 without damaging or destroying Q2 or violating the tri-state requirement.

Comparison circuit 22 is preferably implemented with a pair of FETs MP1 and MP2. The drain-source circuit of MP1 is connected between VDD and node 24, with its gate connected to OUT. Similarly, the drain-source circuit of MP2 is connected between OUT and node 24, with its gate connected to VDD. When so arranged, the greater of OUT and VDD appears at node 24. When this voltage is connected to the base of Q2 via switch 26, the extended output voltage swing defined above is achieved.

Switch 26 is preferably implemented with a FET MP3, having its drain-source circuit connected between Q2's base and node 24, and receiving tri-state control signal 28 at its gate.

As noted above, when Q2 is to be in a high impedance state, its base is connected to the greater of OUT and VDD. However, if the interface circuit has other low impedance voltage paths available which might be even higher than OUT or VDD, comparison circuit 22 can be adapted to include these voltages in the comparison with OUT and VDD, or to compare OUT with one of these voltages instead of with VDD. In all cases, comparison circuit 22 is arranged to provide the highest available voltage at node 24.

Note that while the implementations of comparison circuits 12 and 22 and switches 16 and 26 shown in FIGS. 1a and 1b are preferred, the invention is not limited to these implementations. Many other circuit designs could be employed to provide the comparison function required of comparison circuits 12 and 22, and the switching function provided by switches 16 and 26.

Figure 2:
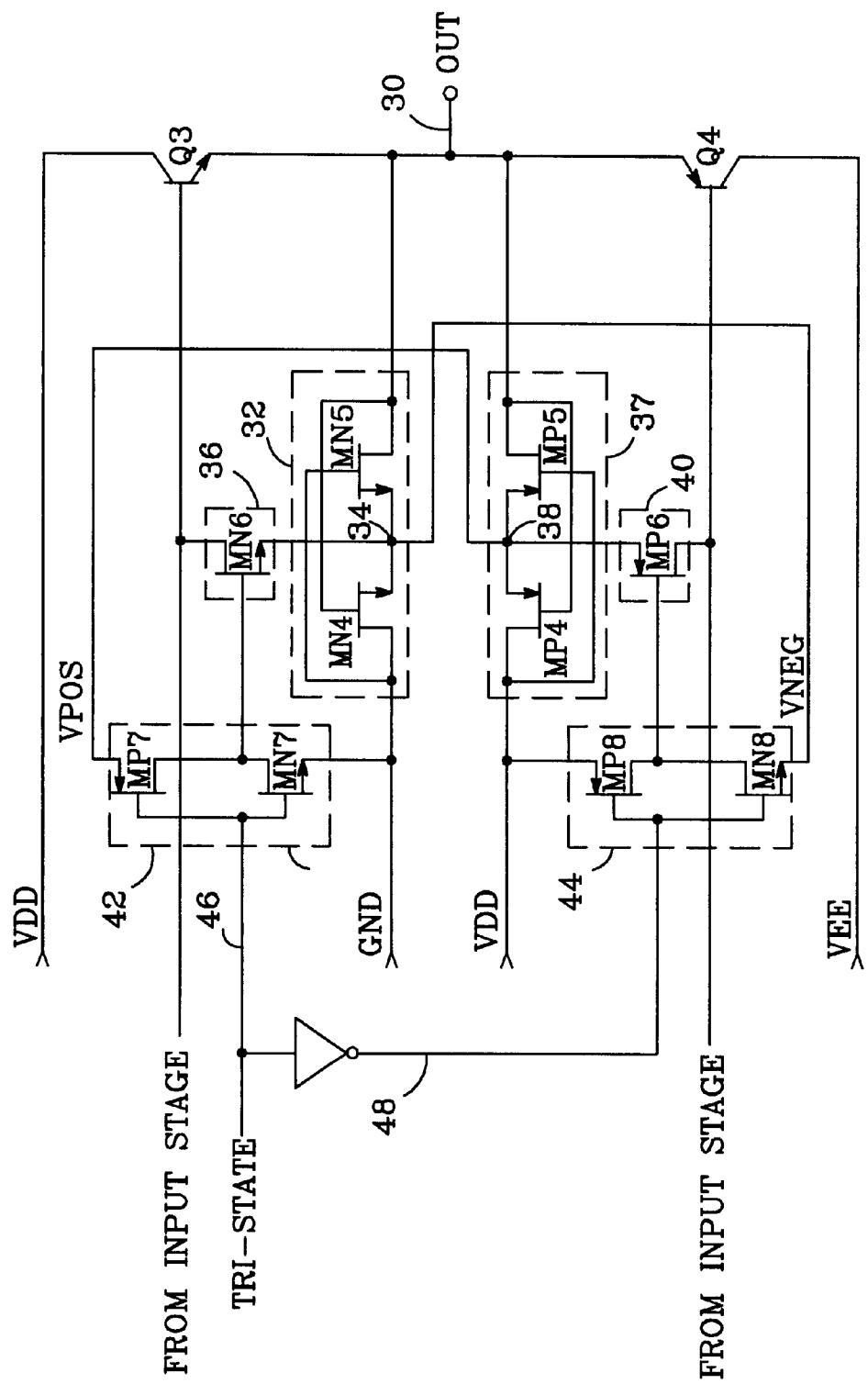
FIG. 2 is a schematic diagram of a bipolar breakdown enhancement circuit as might be used with an output stage which includes both NPN and PNP emitter follower-connected output transistors.

A preferred embodiment of the invention is shown in FIG. 2. Here, the interface circuit's output stage includes both an NPN output transistor Q3 and a PNP output transistor Q4. Q3's collector-emitter circuit is connected between a supply voltage VDD and an output terminal 30, and Q4's collector-emitter circuit is connected between a supply voltage VEE and output terminal 30. The interface circuit also include a ground terminal GND, which is typically at ground potential but may also be non-zero. Q3 and Q4 are driven with respective drive signals and produce a GND-referenced output voltage OUT at output terminal 30 in response.

Q3 and Q4 each have breakdown enhancement circuits as described above. For Q3, a comparison circuit 32 provides the lesser of GND and OUT at a node 34, and the base of Q3 is connected to node 34 via a switch 36 which is closed when Q3 is to be put into a high impedance state. Similarly, for Q4, a comparison circuit 37 provides the greater of VDD and OUT at a node 38, and the base of Q4 is connected to node 38 via a switch 40 which is closed when Q4 is to be put into a high impedance state.

This arrangement serves to extend the high impedance voltage swing in the same manner as was discussed above. Without the invention, with the Q1 and Q2 bases left floating, the high impedance output voltage swing range is given by:

$$(GND-BV_{eco}(Q2)) \text{ to } (VDD+BV_{eco}(Q1))$$

However, when configured as shown in FIG. 2, the high impedance output voltage swing range is extended from $BV_{eco}$ to $BV_{ecs}$. Thus, when employing the present breakdown enhancement circuit, the high impedance output voltage swing range is given by:

$$(GND-BV_{ecs}(Q2)) \text{ to } (VDD+BV_{ecs}(Q1)).$$

As an example, assume the following parameters:
VDD=5 volts
GND=0 volts
$BV_{eco}(Q1)$=5 volts
$BV_{eco}(Q2)$=10 volts
$BV_{ecs}(Q1)$=10 volts
$BV_{ecs}(Q2)$=20 volts The allowable output voltage swing with the bases of Q1 and Q2 left open is given by:

$$(GND-BV_{eco}(Q2)) \text{ to } (VDD+BV_{eco}(Q1))=-10 \text{ volts to } +10 \text{ volts}.$$

When used with the invention, however, the allowable output voltage swing is given by:

$$(GND-BV_{ecs}(Q2)) \text{ to } (VDD+BV_{ecs}(Q1))=-20 \text{ volts to } +15 \text{ volts}.$$

This extended voltage swing enables the interface circuit to tolerate a wider range of voltages on output terminal 30 without damaging or destroying Q1 or Q2, or violating the tri-state requirement.

Comparison circuit 32 is preferably implemented as discussed above: a FET MN4 is connected between GND and node 34 and controlled by OUT, and a FET MN5 is connected between OUT and node 34 and controlled by GND. Switch 36 is also preferably implemented as discussed above, using a FET MN6.

Comparison circuit 37 is similarly implemented: a FET MP4 is connected between VDD and node 38 and controlled by OUT, and a FET MP5 is connected between OUT and node 34 and controlled by VDD. Switch 40 is also preferably implemented as discussed above, using a FET MP6.

In some applications, the interface circuit may be powered down, while the external circuitry connected to output terminal 30 continues to operate. Under these conditions, it may be desirable for the breakdown enhancement circuit to continue to operate, even when VDD=GND. One way in which this can be accommodated is illustrated in FIG. 2. Tri-state switch 36 is driven with an inverter circuit 42, and tri-state switch 40 is driven with an inverter circuit 44. A tri-state control signal 46 is connected to inverter circuit 42, and an inverted version 48 of tri-state control signal 46 is connected to inverter circuit 44. A low-going tri-state control signal 46 causes switches 36 and 40 to be turned on and Q3 and Q4 to be put into a high impedance state.

Each of inverter circuits 42 and 44 are preferably made from a PMOS FET and an NMOS FET: FETs MP7 and MN7 make up inverter 42, and FETs MP8 and MN8 make up inverter 44. Inverter circuit 42 is powered via a connection to node 38 (labeled VPOS), and inverter circuit 44 is powered via a connection to node 34 (labeled VNEG). VPOS provides a positive voltage relative to VNEG, which enables inverter circuit 42 to operate (and switch 36 to be controlled) such that Q3's base can be connected to node 34. Similarly, VNEG provides a negative voltage relative to VPOS, which enables inverter circuit 44 to operate (and switch 40 to be controlled) such that Q4's base can be connected to node 38.

When the interface circuit is unpowered (VDD=GND=VPOS), inverter transistors MP7 and MN7 are unpowered. However, the output of MP7/MN7 will drift to VDD=GND=VPOS and is pinned to within a $V_{be}$ drop of VDD=GND=VPOS through parasitic diode currents. This looks like a logic "high" signal to switch transistor MN6 (source=body=VNEG), turning MN6 on and shorting the base of Q3 to VNEG. Similar mechanisms cause switch transistor MP6 to be turned on when the interface circuit is unpowered, such that the base of Q4 is shorted to VPOS.

Note that for proper operation, the drain-source breakdown voltages ($BV_{ds}$) of FETs MN1–MN8 and MP1–MP8 need to be sufficiently high. If the $BV_{ds}$ voltages are too low, the output stage's tri-state breakdown voltage may be limited by the FETs instead of bipolar output transistors Q1–Q4.

While particular embodiments of the invention have been shown and described, numerous variations and alternate embodiments will occur to those skilled in the art. Accordingly, it is intended that the invention be limited only in terms of the appended claims.

I claim:

1. A bipolar breakdown enhancement circuit for use with a tri-state output stage, comprising:
   a supply voltage,
   a ground terminal which is at a ground potential,
   an NPN emitter follower-connected bipolar output transistor, the collector-emitter circuit of said output transistor connected between said supply voltage and an output terminal, said transistor arranged to produce an output voltage at said output terminal which is referenced to said ground potential,
   a comparison circuit which produces an output equal to the lesser of said output voltage and said ground potential, wherein said comparison circuit comprises first and second FETs, said first FET connected between said ground terminal and a common node and arranged to conduct a first current to said common node in response to said output voltage and said second FET connected between said output terminal and said common node and arranged to conduct a second current to said common node in response to said ground potential, said common node being the output of said comparison circuit, and
   a switch arranged to connect the base of said output transistor to the output of said comparison circuit in response to a tri-state control signal which is asserted when said output transistor is to be placed in a high-impedance state.

2. The breakdown enhancement circuit of claim 1, wherein said switch comprises a FET connected between the base of said output-transistor and said common node.

3. The breakdown enhancement circuit of claim 1, wherein said output transistor has shorted base breakdown voltage parameters $BV_{ces}$ and $BV_{ecs}$, and the allowable output swing at said output terminal when said output transistor is an a high-impedance state is given by:

$(VDD-BV_{ces})$ to $(VDD+BV_{ecs})$, where $VDD$ is equal to said supply voltage.

4. A bipolar breakdown enhancement circuit for use with a tri-state output stage, comprising:

supply voltage, a ground terminal which is at a ground potential, a PNP emitter follower-connected bipolar output transistor, the collector-emitter circuit of said output transistor connected between said ground terminal and an output terminal, said transistor arranged to produce an output voltage at said output terminal which is referenced to said ground potential, a comparison circuit which produces an output equal to the greater of said output voltage and said supply voltage, wherein said comparison circuit comprises first and second FETs, said first FET connected between said supply voltage and a common node and arranged to conduct a first current to said common node in response to said output voltage and said second FET connected between said output terminal and said common node and arranged to conduct a second current to said common node in response to said supply voltage, said common node being the output of said comparison circuit, and a switch arranged to connect the base of said output transistor to the output of said comparison circuit in response to a tri-state control signal which is asserted when said output transistor is to be placed in a high-impedance state.

5. The breakdown enhancement circuit of claim 4, wherein said switch comprises a FET connected between the base of said output transistor and said common node.

6. The breakdown enhancement circuit of claim 4, wherein said output transistor has shorted base breakdown voltage parameters $BV_{ces}$ and $BV_{ecs}$, and the allowable output swing at said output terminal when said output transistor is an its high-impedance mode is given by:

$(GND-BV_{ecs})$ to $(GND+BV_{ces})$, where $GND$ is equal to said ground potential.

7. A bipolar breakdown enhancement circuit for use with a tri-state output stage, comprising:

a first supply voltage VDD, a second supply voltage VEE, a ground terminal which is at a ground potential GND, an NPN emitter follower-connected bipolar output transistor, the collector-emitter circuit of said NPN output transistor connected between VDD and an output terminal, a PNP emitter follower-connected bipolar output transistor, the collector-emitter circuit of said PNP output transistor connected between VEE and said output terminal, said output/transistors arranged to produce an output voltage at said output terminal which is referenced to said ground potential, a first comparison circuit connected to said output voltage and said ground potential at respective inputs and which produces an output equal to the lesser of said output voltage and said ground potential, a second comparison circuit connected to said output voltage and said supply voltage at respective inputs and which produces an output equal to the greater of said output voltage and said supply voltage, a first switch arranged to connect the base of said NPN output transistor to the output of said first comparison circuit in response to a first tri-state control signal which is asserted when said NPN output transistor is to be placed in a high-impedance state, and a second switch arranged to connect the base of said PNP output transistor to the output of said second comparison circuit in response to a second tri-state control signal which is asserted when said PNP output transistor is to be placed in a high-impedance state.

8. The breakdown enhancement circuit of claim 7, wherein said first comparison circuit comprises first and second FETs, said first FET connected between said ground terminal and a common node and arranged to conduct a first current to said common node in response to said output voltage and said second FET connected between said output terminal and said common node and arranged to conduct a second current to said common node in response to said ground potential, said common node being the output of said first comparison circuit.

9. The breakdown enhancement circuit of claim 8, wherein said first switch comprises a FET connected between the base of said NPN output transistor and said common node.

10. The breakdown enhancement circuit of claim 7, wherein said second comparison circuit comprises first and second FETs, said first FET connected between said supply voltage and a common node and arranged to conduct a first current to said common node in response to said output voltage and said second FET connected between said output terminal and said common node and arranged to conduct a second current to said common node in response to said supply voltage, said common node being the output of said second comparison circuit.

11. The breakdown enhancement circuit of claim 10, wherein said first switch comprises a FET connected between the base of said PNP output transistor and said common node.

12. The breakdown enhancement circuit of claim 7, wherein said NPN output transistor has a shorted base breakdown voltage parameter $BV_{ecs}NPN$ and said PNP output transistor has a shorted base breakdown voltage parameter $BV_{ecs}PNP$, and the allowable output swing at said output terminal when said output transistors are in a high-impedance state is given by:

$(-BV_{ecs}PNP+GND)$ to $(+BV_{ecs}NPN+VDD)$.

13. The breakdown enhancement circuit of claim 7, wherein said first tri-state control signal is provided by a first inverter circuit and said second tri-state control signal is provided by a second inverter circuit, said first inverter circuit powered by the output (VPOS) of said second comparison circuit and said second inverter circuit powered by the output (VNEG) of said first comparison circuit such that said output transistors remain in their tri-state mode when VDD=GND.

14. The breakdown enhancement circuit of claim 13, wherein said first inverter circuit compriss a PMOS FET and an NMOS FET connected in series between the VPOS and GND, the junction of said PMOS and NMOS FETs providing said first tri-state control signal.

15. The breakdown enhancement circuit of claim 13, wherein said second inverter circuit comprises a PMOS FET and an NMOS FET connected in series between said VDD and VNEG, the junction of said PMOS and NMOS FETs providing said second tri-state control signal.

16. A bipolar breakdown enhancement circuit for use with a tri-state output stage, comprising:

- a first supply voltage VDD,
- a second supply voltage VEE,
- a ground terminal which is at a ground potential GND,
- an NPN emitter follower-connected bipolar output transistor, the collector-emitter circuit of said NPN output transistor connected between VDD and an output terminal,
- a PNP emitter follower-connected bipolar output transistor, the collector-emitter circuit of said PNP output transistor connected between VEE and said output terminal, said output transistors arranged to produce an output voltage at said output terminal which is referenced to said ground potential,
- a first comparison circuit which produces an output equal to the lesser of said output voltage and said ground potential, said first comparison circuit comprising first and second FETs, said first FET connected between said ground terminal and a first common node and arranged to conduct a current to said first common node in response to said output voltage and said second FET connected between said output terminal and said first common node and arranged to conduct a current to said first common node in response to said ground potential, said first common node being the output of said first comparison circuit,
- a second comparison circuit which produces an output equal to the greater of said output voltage and said supply voltage, said second comparison circuit comprising third and fourth FETs, said third FET connected between said supply voltage and a second common node and arranged to conduct a current to said second common node in response to said output voltage and said fourth FET connected between said output terminal and said second common node and arranged to conduct a current to said second common node in response to said supply voltage, said second common node being the output of said second comparison circuit,
- a fifth FET arranged to connect the base of said NPN output transistor to the output of said first comparison circuit in response to a tri-state control signal which is asserted when said NPN output transistor is to be placed in a high-impedance state, and
- a sixth FET arranged to connect the base of said PNP output transistor to the output of said second comparison circuit in response to a tri-state control signal which is asserted when said PNP output transistor is to be placed in a high-impedance state,
- wherein said NPN output transistor has a shorted base breakdown voltage parameter $BV_{ecs}NPN$ and said PNP output transistor has a shorted base breakdown voltage parameter $BV_{ecs}PNP$, and the allowable output swing at said output terminal when said output transistors are in their high-impedance states is given by:

$$(-BV_{ecs}PNP+GND) \text{ to } (+BV_{ecs}NPN+VDD).$$

17. The breakdown enhancement circuit of claim 16, wherein said fifth FET receives a first tri-state control signal and said sixth FET receives a second tri-state control signal, said first tri-state control signal provided by a first inverter circuit and said second tri-state control signal provided by a second inverter circuit, said first inverter circuit powered by the output of said second comparison circuit and said second inverter circuit powered by the output of said first comparison circuit such that said output transistors remain in their tri-state mode when VDD=GND.

* * * * *